US009208826B2

(12) United States Patent
Yamauchi

(10) Patent No.: US 9,208,826 B2
(45) Date of Patent: Dec. 8, 2015

(54) SEMICONDUCTOR STORAGE DEVICE WITH TWO CONTROL LINES

(71) Applicant: Sharp Kabushiki Kaisha, Osaka (JP)

(72) Inventor: Yoshimitsu Yamauchi, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/388,436

(22) PCT Filed: Feb. 27, 2013

(86) PCT No.: PCT/JP2013/055133
§ 371 (c)(1),
(2) Date: Sep. 26, 2014

(87) PCT Pub. No.: WO2013/146039
PCT Pub. Date: Oct. 3, 2013

(65) Prior Publication Data
US 2015/0049535 A1 Feb. 19, 2015

(30) Foreign Application Priority Data
Mar. 30, 2012 (JP) .................... 2012-079276

(51) Int. Cl.
*G11C 11/24* (2006.01)
*G11C 5/02* (2006.01)
*G11C 11/405* (2006.01)
*H01L 27/115* (2006.01)
*G11C 11/40* (2006.01)
*H01L 27/12* (2006.01)

(52) U.S. Cl.
CPC *G11C 5/02* (2013.01); *G11C 11/24* (2013.01); *G11C 11/40* (2013.01); *G11C 11/405* (2013.01); *H01L 27/115* (2013.01); *H01L 27/1156* (2013.01); *H01L 27/1225* (2013.01)

(58) Field of Classification Search
CPC .................. G11C 16/0433; H01L 29/7869
USPC ........................................ 365/149; 257/300
See application file for complete search history.

(56) References Cited

U.S. PATENT DOCUMENTS 8,415,731 B2 * 4/2013 Yamazaki et al. ............ 257/300
8,507,907 B2 * 8/2013 Takahashi et al. ............. 257/43
(Continued)

FOREIGN PATENT DOCUMENTS

| JP | 2002-198449 A | 7/2002 |
| JP | 2011-129892 A | 6/2011 |
| JP | 2012-212499 A | 11/2012 |

OTHER PUBLICATIONS

Matsuzaki et al., "1Mb Non-Volatile Random Access Memory Using Oxide Semiconductor", Memory Workshop (IMW), 2011 3rd IEEE International, May 2011.

*Primary Examiner* — Son Mai
(74) *Attorney, Agent, or Firm* — Chen Yoshimura LLP

(57) ABSTRACT

Provided is a semiconductor storage device with which it is possible to write information to individual memory cells in which a storage node is configured with an oxide semiconductor insulated-gate FET source and a terminal of a capacitor element being connected. A storage node is configured by connecting a source of a first transistor to one terminal of a capacitor element. A drain of the first transistor and a source of a second transistor are connected to each other. A drain of the second transistor is a data input terminal. A first control terminal, which is formed by a gate of the first transistor being connected to another terminal of the capacitor element, is connected to a wordline, which extends in the row direction. A second control terminal, which is formed of a gate of the second transistor terminal, is connected to a write control line, which extends in the column direction. The storage node is connected to a gate of a third transistor, and a current flowing between a drain and a source of the third transistor is controlled according to a voltage level of the storage node.

6 Claims, 6 Drawing Sheets

(56) References Cited

U.S. PATENT DOCUMENTS 8,582,348 B2 * 11/2013 Inoue et al. ............... 365/149

2011/0121285 A1 5/2011 Yamazaki et al.
2012/0236634 A1 9/2012 Matsubayashi

* cited by examiner (A)

(B)

(A)

(B)

SEMICONDUCTOR STORAGE DEVICE WITH TWO CONTROL LINES

TECHNICAL FIELD

The present invention relates to a semiconductor storage device provided with an oxide semiconductor insulated-gate FET (field effect transistor).

BACKGROUND ART

There are two main types of semiconductor storage devices: RAM (random access memory) and ROM (read only memory). There is no limit on the number of write cycles for RAM, but because the stored data is deleted when the power is turned off, the problem with RAM is that the power consumption for storing data during standby becomes large. On the other hand, ROM can store data even after the power is turned off, but ROM has a limited number of write cycles, and thus, cannot be used where frequent rewriting is needed. Thus, research and development of NVRAM (non-volatile random-access memory) that has no limit in the number of writing cycles and that can store data written with very low power consumption has been in progress for a long time, but NVRAM has not yet been made into a product.

Insulated-gate FETs such as a MOSFET that use an oxide semiconductor with a wider bandgap than silicon are anticipated to greatly reduce the leakage current compared to silicon MOSFETs, and NVRAM developed using a MOSFET made of an oxide semiconductor is reported in Non-Patent Document 1 below.

As shown in FIG. 6, a memory cell disclosed in Non-Patent Document 1 is provided with a regular silicon MOSFET 30, a capacitor 31 that has an end connected to a gate FN of the silicon MOSFET 30, and an oxide semiconductor MOSFET 32 in which the gate FN is connected to a source or a drain of the MOSFET 32. By using the silicon MOSFET 30 and the capacitor 31, an equivalent to a silicon MOSFET (memory device) having a stacked gate structure in which a floating gate and a control gate used in conventional memory cells are layered is formed. In conventional flash memories, input and output of charges from the floating gate are performed via a thin gate insulating film by hot carrier injection, FN tunneling, or the like. However, in the case of a memory cell with a circuit configuration that is shown in FIG. 6, the input and output of charges is performed via the oxide semiconductor MOSFET 32. As a result, there is no need to form a strong electric field for inputting and outputting charges from the floating gate FN, and the data can be overwritten with low voltage and at a high speed; thus, there is no limit to the number of write cycles. Furthermore, because the leakage current of the oxide semiconductor MOSFET 32 is small, the stored charge of the floating gate FN can be stored stably for a long period of time.

RELATED ART DOCUMENT

Non-Patent Document

Non-Patent Document 1: Takanori Matsuzaki, et al., "1 Mb Non-Volatile Random Access Memory Using Oxide Semiconductor", Memory Workshop (IMW), 2011 3rd IEEE International, May 2011.

SUMMARY OF THE INVENTION

Problems to be Solved by the Invention

In the memory cell in Non-Patent Document 1, information is stored in the same manner as conventional flash memories by controlling the threshold voltage of a silicon MOSFET 30 that has another end of a capacitor 31 as a control gate CG and a floating gate type MOSFET (memory device) formed of the capacitor 31, depending on the size of the charge stored in the floating gate FN. Furthermore, like the conventional flash memory cell, the information stored by varying the size of the charge stored in the floating gate FN is read by controlling the voltage applied to the control gate CG (another end of the capacitor 31) so as to vary the conduction state between the drain and the source of the silicon MOSFET 30 by varying the size of the stored charge.

If a memory cell array is configured by arranging the memory cells mentioned in the Non-Patent Document 1 in a matrix, then the drains of the silicon MOSFETs 30 are connected to a bitline that extends along a column direction, the control gates CG being connected to the wordline extending in the row direction, and by having the oxide semiconductor MOSFETs 32 of the respective memory cells in the OFF state, the voltage applied to the bitline and the wordline can be controlled, and thus information can be read from individual memory cells. However, if a gate WG of the oxide semiconductor MOSFET 32 of memory cells in the same row or column are connected to a common writing control line that extends in the row direction or the column direction, then memory cells in the same row or column are selected simultaneously, and a charge that corresponds to a voltage applied to the data input line DL connected to another source or another drain of the oxide semiconductor MOSFET accumulates in the floating gate FN, and thus, information cannot be written to individual memory cells.

The present invention was made in view of the above-mentioned problems and an object thereof is to provide a semiconductor storage device that can write information to individual memory cells in which a storage node is formed by connecting the source of the oxide semiconductor insulated-gate FET to an end of the capacitor.

Means for Solving the Problems

To achieve the above-mentioned object, a semiconductor storage device of first characteristics is provided, the semiconductor storage device including: a memory cell including a first transistor that is an oxide semiconductor insulated-gate field-effect transistor, a second transistor that is an oxide semiconductor insulated-gate field-effect transistor, and a capacitor and a third transistor, wherein either one of a drain and a source of the first transistor is connected to one end of the capacitor, defining a storage node, wherein another of the drain or the source of the first transistor is connected to one of a drain or a source of the second transistor, wherein another of the drain or the source of the second transistor is a data input terminal, wherein a first control terminal, defined by a connection between another end of the capacitor and either one of respective gates of the first transistor and the second transistor, is connected to a first control line extending in a first direction, wherein a second control terminal that is another of the respective gates of the first transistor or the second transistor is connected to a second control line extending in a second direction that is perpendicular to the first direction, and wherein the storage node between the first transistor and the capacitor is connected to a gate of the third transistor and controls a current flowing between a drain and a source of the third transistor according to a voltage level of the storage node.

Furthermore, in the semiconductor storage device according to the first characteristics mentioned above, it is preferable that the first transistor and the second transistor be thin film transistors formed on an insulating film formed over a surface of a semiconductor substrate where the third transistor is formed.

Furthermore, in the semiconductor storage device according to the first characteristics mentioned above, it is preferable that an oxide semiconductor that forms the first transistor and the second transistor be InGaZnO.

Furthermore, the semiconductor storage device according to the first characteristics mentioned above includes: a memory cell array that has a plurality of the memory cells arranged in a matrix in the first direction and the second direction, wherein each of the plurality of memory cells is provided with the third transistor as a transistor for reading data stored in the storage node between the first transistor and the capacitor, wherein every row of memory cells in the memory cell array extending in the first direction shares the first control line, extending in the first direction, wherein every column of the memory cells in the memory cell array extending in the second direction shares the second control line extending in the second direction, and wherein the data input terminals of the plurality of memory cells in each row in the first direction are connected to a shared data input line extending in the first direction, or the data input terminals of the plurality of memory cells in each column in the second direction are connected to a shared data input line extending in the second direction.

Furthermore, in the semiconductor storage device according to the second characteristics mentioned above, drains or sources of a plurality of the third transistors arranged in each column in the second direction are connected to a shared reading signal line extending in the second direction, and the data input terminals of the plurality of the memory cells arranged in each column in the second direction are connected to the data input line extending in the second direction, shared therebetween.

Furthermore, in the semiconductor storage device according to the first and second characteristics mentioned above, the third transistor is a transistor used in a reconfigurable logic circuit.

Effects of the Invention

According to the semiconductor storage devices with the first and second characteristics, by applying a prescribed selection voltage to the first control line and the second control line to turn ON the respective first and second transistors based on the initial state of the storage node when data is to be written, an input voltage based on the data to be written applied to the data input terminal is transmitted to the storage node, and a voltage difference between the input voltage and the selection voltage applied to the first control terminal is stored on both ends of the capacitor, thereby writing data. The charge amount is the voltage difference multiplied by the electric capacitance of both ends of the capacitor. Furthermore, a prescribed non-selection voltage that turns the first or second transistor OFF is applied to either one or both of the first control line and the second control line, and thus, the connection between the data input terminal and the storage node is blocked, resulting in the input voltage based on the data, applied to the data input terminal, to be written to other memory cells being prevented from being transmitted to the storage node, and therefore, the data is not written. Thus, by controlling the individual voltages applied respectively to the first control lines and the second control lines, data can be written to individual memory cells.

After the input voltage is written into the storage node, by at least turning either one of the first and second transistors OFF, the storage node enters a floating state, and stored charges that correspond to written data can be kept continuously in the storage node. Here, oxide semiconductor transistors that can achieve very small leakage current compared to if the first and second transistors were silicon transistors are used, and thus, the charge accumulated to the storage node can be kept stably for a long time, and therefore, the power consumption associated with storing data can be reduced greatly, and the conduction state of the third transistor can be controlled in a non-volatile manner.

Furthermore, in the semiconductor storage devices with the first and second characteristics, the first and second transistors are formed of the thin film transistor over an insulating film over a surface of the semiconductor substrate where the third transistor is formed, and thus, a circuit including the memory cell and the third transistor can be formed three dimensionally by stacking the memory cell over the third transistor, and thus, the mounting surface of the semiconductor storage device can be reduced in area.

Furthermore, according to the semiconductor storage device with the third characteristics, the third transistor is used as a transistor for reading, and can be used to read data stored in the storage node in individual memory cells. Specifically, when data is being read, by shifting the voltage level of the storage node by applying a prescribed selection voltage to the first control line and thereby changing the current flowing between the drain and the source of the third transistor according to the data to be written, and by detecting the amount of the current using a reading signal line from the memory cell that is connected to the first control line where a prescribed selection voltage is applied, the storage data can be read from individual memory cells. Furthermore, by applying the prescribed non-selection voltage to the first control line to shift the voltage level of the storage node and turning off the third transistor regardless of the data to be written, it is possible to stop the reading of data from the memory cell connected to the first control line where the prescribed non-selection voltage is applied. Also, according to the semiconductor storage device with the third characteristics, it is possible to attain a non-volatile random-access memory from which data can be read and to which data can be written fast.

Also, according to the semiconductor storage device with the fourth characteristics, data that defines the logical configuration of a reconfigurable logic circuit such as a field programmable gate array (FPGA) or a programmable logic device (PLD) is stored within a memory cell array, and by doing so, a non-volatile and reconfigurable logic circuit that does not need to reconfigure the logical configuration each time the power is turned ON can be achieved.

DETAILED DESCRIPTION OF EMBODIMENTS

Below, embodiments of a semiconductor storage device of the present invention will be described with reference to figures.

Embodiment 1

In Embodiment 1, the circuit configuration of a memory cell and the writing operation of data in the semiconductor storage device (hereinafter, "storage device") of the present invention will be described.

Figure 1:
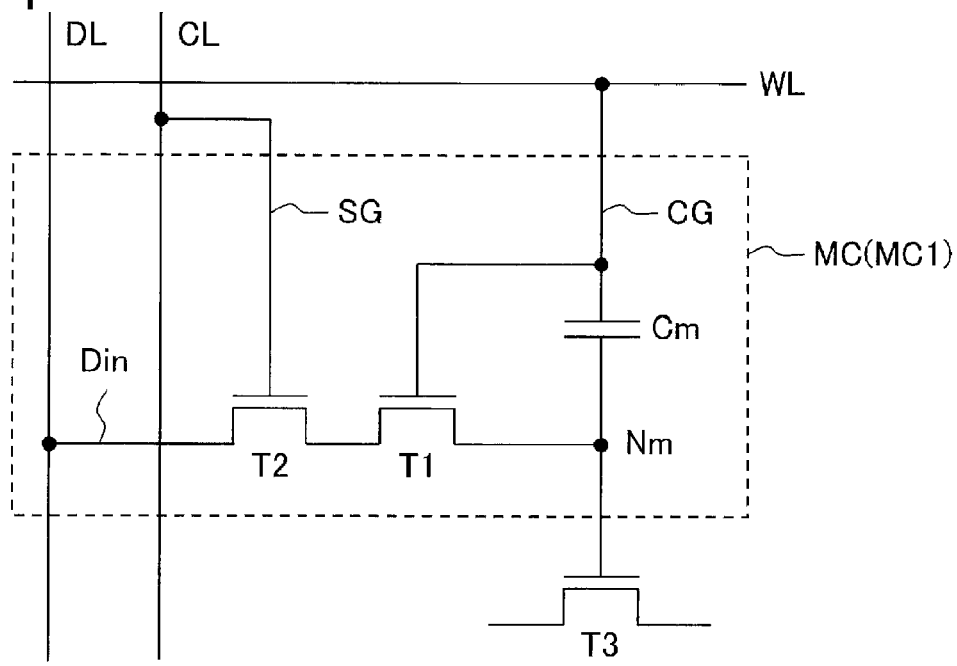
FIG. 1 is an equivalent circuit diagram showing an example of a circuit configuration of two types of memory cells in a semiconductor storage device of the present invention.
Figure 1:
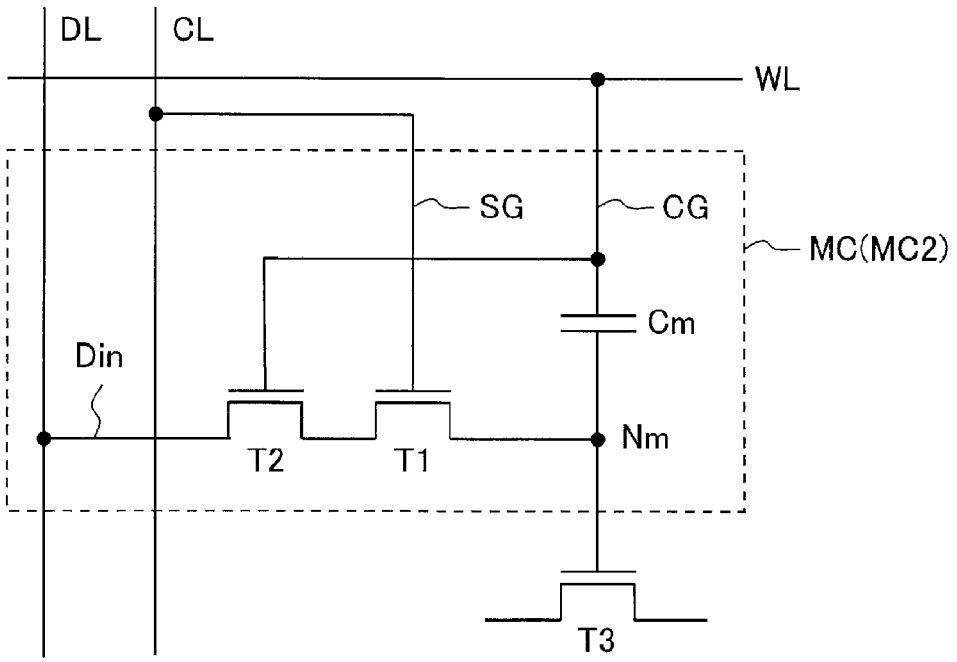

FIGS. 1(A) and 1(B) show an equivalent circuit diagram of two types of memory cells MC (MC1, MC2). Both types of memory cells MC have a first transistor T1 that is an oxide semiconductor insulated-gate FET, a second transistor T2 that is an oxide semiconductor insulated-gate FET, and a capacitor Cm.

Figure 2:
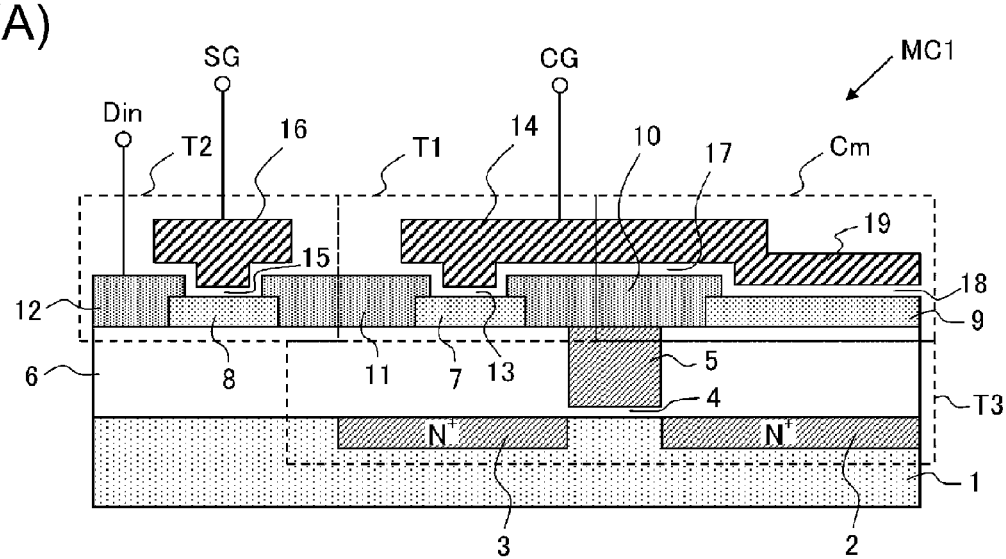
FIG. 2 is a cross-sectional view schematically showing examples of cross-sectional structures of two types of memory cells in a semiconductor storage device of the present invention.
Figure 2:
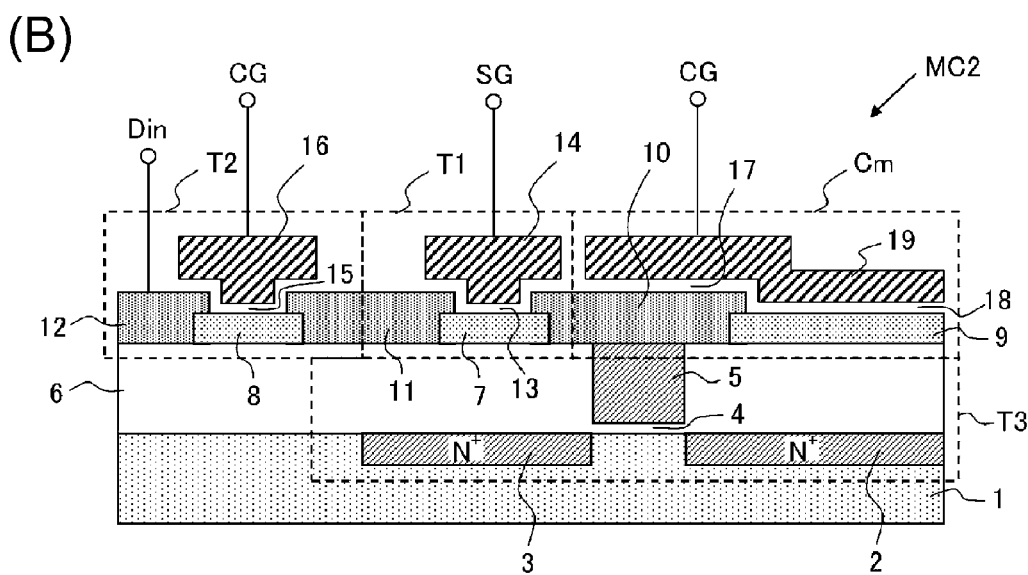

As shown in FIGS. 1(A) and 1(B), in each memory cell MC, a storage node NM is formed of a source of a first transistor T1 and an end of a capacitor Cm connected thereto, the drain of the first transistor T1 being connected to the source of the second transistor T2, the drain of the second transistor T2 being connected to the data input terminal Din. Also, as shown in FIG. 2, the first and second transistors T1 and T2 have a structure in which the drain and source are in symmetry with a gate therebetween, and thus, even if the drain and source are interchanged, the connection relationship in the memory cell MC mentioned is the same.

As shown in FIG. 1(A), a first type memory cell MC1 has a first control terminal CG configured by connecting the gate of the first transistor T1 to the other end of the capacitor Cm, the gate of the second transistor T2 being a second control terminal SG. On the other hand, as shown in FIG. 1(B), a second type memory cell MC2 has a first control terminal CG configured by connecting the gate of the second transistor T1 to the other end of the capacitor Cm, the gate of the first transistor T1 being a second control terminal SG.

As shown in FIGS. 1(A) and 1(B), within the respective memory cells MC, the first control terminal CG is connected to the wordline WL (corresponding to the first control line) that extends in the row direction (corresponding to the first direction), and the second control terminal SG is connected to the write control line CL (corresponding to the second control line) extending in the column direction (corresponding to the second direction). Both memory cells MC have the other end of the capacitor Cm connected to the wordline WL. The only difference between the two types of memory cells MC1 and MC2 is that the respective gates of the first and second transistors T1 and T2 are interchanged in terms of being connected to the wordline WL or the write control line CL, but the basic functions thereof are otherwise completely the same.

In the respective memory cells MC of the present embodiment, the data input terminal Din is connected to the data input line DL that extends in the column direction. Furthermore, the storage node Nm is connected to the gate of the third transistor T3, which is to be controlled, the current flowing between the drain and the source of the third transistor T3 being controlled by the voltage level of the storage node Nm.

FIGS. 2(A) and 2(B) schematically show an example of a cross-sectional structure of each memory cell MC (MC1, MC2). As shown in FIG. 2, both memory cells MC1 and MC2 have cross-sectional structures that are essentially the same. The third transistor T3 that is to be controlled by each memory cell MC is formed as an n-channel MOSFET on the silicon substrate 1. The third transistor T3 include a drain region 2 and a source region 3 that are formed of an n-type impurity region, and a gate 5 that is formed of polycrystalline silicon across a first gate insulating film 4 over a channel region between the drain region 2 and the source region 3. The third transistor T3 is manufactured using a general process for manufacturing a silicon MOSFET.

An insulating film 6 is formed on both sides of the gate 5 of the third transistor T3 that is formed on the surface of the silicon substrate 1, and the first and second transistors T1 and T2 and the capacitor Cm that constitute each memory cell MC are formed over the gate 5 and the insulating film 6. In the present embodiment, the first and the second transistors T1 and T2 are respectively n-channel thin film transistors (TFTs).

The first transistor T1 includes a first active region (channel region) 7, the first and second metal electrodes 10 and 11 connected to both ends of the first active region 7, and the gate 14 formed over the first active region 7 across an insulating film 13. The second transistor T2 includes a second active region (channel region) 8, second and third metal electrodes 11 and 12 connected to both ends of the second active region 8, and a gate 16 that is formed over the second active region 8 across an insulating film 15. The capacitor Cm has an electrode 19, which is formed of the same conductive material as the gates 14 and 16, disposed over both the first metal electrode 10 and the third active region 9 made of an oxide semiconductor in ohmic contact with the first metal electrode, the electrode 19 being formed over the first metal electrode 10 and the third active layer 9 respectively across an insulating film 17 and a fourth gate insulating film 18. Furthermore, the first metal electrode 10 and the gate 5 of the third transistor T3 constitute the storage node Nm.

In the present embodiment, InGaZnO is used as an oxide semiconductor in the first to third active regions 7 to 9. Furthermore, the first to third metal electrodes 10 to 12 are made of a metal (Ti/Al—Si/Ti, for example) that can be in ohmic contact with InGaZnO and polycrystalline silicon. Also, Ti/Al—Si/Ti, for example, is used as a conductive material constitutes the gates 14 and 16 and the electrode 19. The first and second transistors T1 and T2 and the capacitor Cm are made by a low temperature TFT fabrication process.

As for the first type memory cell MC1 shown in FIG. 2(A), because the first transistor T1 and the capacitor Cm are adjacent to each other, the gate 14 and the electrode 19 are connected to each other to form the first control terminal CG. In the second type memory cell MC2 shown in FIG. 2(B), because the second transistor T2 and the capacitor Cm has the first transistor T1 therebetween, the gate 16 and the electrode 19 are not connected to each other within the memory cell MC2, and the gate 16 and the electrode 19 separately form the first control terminal CG while being connected through the wordline WL outside the memory cell MC2.

Furthermore, in the cross-sectional structure in FIG. 2, a case in which the first and second transistors T1 and T2 are planar type TFTs is shown as an example. However, the transistors can be formed as inverted staggered type TFTs and the specific cross-sectional structure of the memory cells MC is not limited to the structures shown in FIG. 2.

Next, the writing operation of binary data ("0," "1") to the memory cell MC will be described with the first type memory cell MC1 as an example. Here, it is assumed that the threshold voltage of the first and second transistors T1 and T2 is 0V. The writing operation for the second type memory cell MC2 is essentially the same as the first type memory cell MC1, and therefore, descriptions thereof will be omitted.

The voltages to be applied to the wordline WL and the write control line CL connected to the memory cell MC to which data is to be written are respectively shifted from a first non-selection voltage Vu1 to a first selection voltage Vs1 and from the second non-selection voltage Vu2 to the second selection voltage Vs2. In the present embodiment, the first selection voltage Vs1 and the second selection voltage Vs2 are both 10V and the first non-selection voltage Vu1 and the second non-selection voltage Vu2 are both −5V. Furthermore, data input voltages Vd0 and Vd1, which are applied to the data input line DL, corresponding to the binary data are respectively 0V and 10V.

After the voltages applied to the wordline WL and the write control line CL are respectively shifted to the first selection voltage Vs1 and the second selection voltage Vs2, one of the data input voltages Vd0 and Vd1 is applied to the data input line DL. When the voltage of the wordline WL is transitioned from the first non-selection voltage Vu1 to the first selection voltage Vs1, the voltage of the storage node Nm returns to the voltage state after the previous writing operation (0V or 10V). When the voltage of the storage node Nm is 0V or 10V and the same data input voltage Vd0 (0V) or Vd1 (10V) is applied to the data input line DL, then the voltage of the storage node Nm is sustained and not changed. When the voltage of the storage node Nm is 0V or 10V, if an opposite data input voltage Vd1 (10V) or Vd0 (0V) is applied to the data input line DL as the opposite data input voltage Vd0, both the first and second transistors T1 and T2 are ON, and thus, the voltage of the storage node Nm changes to the opposite data input voltage. In a case in which the data input voltage is an intermediate voltage between 0V and 10V, regardless of the voltage state of the storage node Nm, the intermediate voltage is transmitted to the storage node Nm.

After a new data input voltage Vd0 or Vd1 is transmitted to the storage node Nm or the previous voltage state is sustained, the voltages applied to the wordline WL and the write control line CL are restored from the first selection voltage Vs1 to the first non-selection voltage Vu1 and from the second selection voltage Vs2 to the second non-selection voltage Vu2, respectively, and the first and second transistors T1 and T2 are both turned OFF. Because the voltage of the other end of the capacitor Cm changes from the first selection voltage Vs1 (10V) to the first non-selection voltage Vu1 (−5V), the voltage of the storage node Nm changes by a voltage ΔVm0 (=ΔV0×R) in which the voltage change ΔV0 (=−15V) is multiplied by the capacitance ratio R (=Cm/CNm) of the total parasitic capacitance CNm that is parasitic to the storage node Nm and the total capacitance Cm between both ends of the capacitor Cm (in the first type memory cell MC1, for example, the parasitic capacitance and the like between the gate and the source of the first transistor T1 are also included). If R=0.8, then ΔVm0=−12V, and the voltage of the storage node Nm is −12V or −2V. If the threshold voltage of the third transistor to be controlled is 0.7V, then the third transistor is turned OFF (hereinafter, inactive state) regardless of the storage state of the storage node Nm.

Next, a case will be described in which the selected memory cell MC to which data is written and another memory cell MC that does not share therewith either the wordline WL or the write control line CL are deselected, thereby preventing data from being written in the other memory cell. If the wordline WL is not shared, the first transistor T1 is turned OFF because the voltage applied to the wordline WL is sustained by the first non-selection voltage Vu1 (−5V), and thus, the data input voltages Vd0 and Vd1 applied to the data input lines DL are not transferred to the storage node Nm and the voltage state of the storage node Nm is maintained at the previous state. On the other hand, if the write control line CL is not shared, the second transistor T2 is turned OFF because the voltage applied to the write control line CL is sustained by the first non-selection voltage Vu2 (−5V), and thus, the data input voltages Vd0 and Vd1 applied to the data input lines DL are not transmitted to the storage node Nm, and the voltage state of the storage node Nm is maintained at the previous state. Even in a case in which neither the wordline WL nor the write control line CL are shared, the voltage state of the storage node Nm is maintained at the previous state.

Next, the activation operation is described in which the third transistor T3 is changed from being in an inactive state to being in an active state in which the third transistor T3 is controlled so as to be in an ON state or an OFF state according to the binary data stored in the memory cell MC. Furthermore, in the description below, the threshold voltage of the third transistor to be controlled is 0.7V, for example, and the source voltage is in the range of 0 to 4.5V, for example. As mentioned above, if the voltages applied to the wordline WL and the write control line CL are the first non-selection voltage Vu (−5) and the second non-selection voltage Vu2 (−5V), the first and second transistors T1 and T2 are both in the OFF state, and the voltage level of the storage node is: 12V or −2V, for example, and the third transistor to be controlled is in the OFF state regardless of the storage state of the memory cell MC. When the voltage applied to the write control line CL is maintained at the second non-selection voltage VU2 (−5V) and the second transistor T2 is maintained in the OFF state, and the voltage applied to the wordline WL is changed to the reading voltage Vr (4V, for example) from the first non-selection voltage Vu1 (−5V), then the voltage at the other end of the capacitor Cm similarly changes, and thus, the voltage of the storage node Nm changes as much as the voltage ΔVm1 (=ΔV1×R), in which the capacitance ratio R (=Cm/CNm) is multiplied by the voltage change ΔV1 (+9V). If R=0.8, then ΔVm1=+7.2V, and the voltage of the storage node Nm becomes −4.8V or +5.2V. As a result, the third transistor is controlled to be in the ON state or the OFF state (hereinafter, active state) according to the storage state of the storage node Nm. Therefore, the current flowing between the drain and the source of the third transistor is controlled according to the storage state of the storage node Nm. If multi-value data is stored in the storage node Nm, then the current can be controlled in multiple stages. In a case in which there are a plurality of memory cells MC and a plurality of the third transistors to be controlled, the reading voltage Vr simply needs to be applied to all of the wordlines WL that are connected to any of the memory cells MC to activate all of the third transistors.

Embodiment 2

The circuit configuration and the circuit operation for a non-volatile random-access memory (hereinafter, NVRAM) constituted of the memory cell MC described in Embodiment 1 will be described. Embodiment 2 is described with the first type memory cell MC1 as an example of a memory cell MC. Even if a second type memory cell MC2 is used, the writing operation for the memory cell MC is the same as for the first type memory cell MC1, and thus, the operation of the NVRAM is also essentially the same as the first type memory cell MC1.

Figure 3:
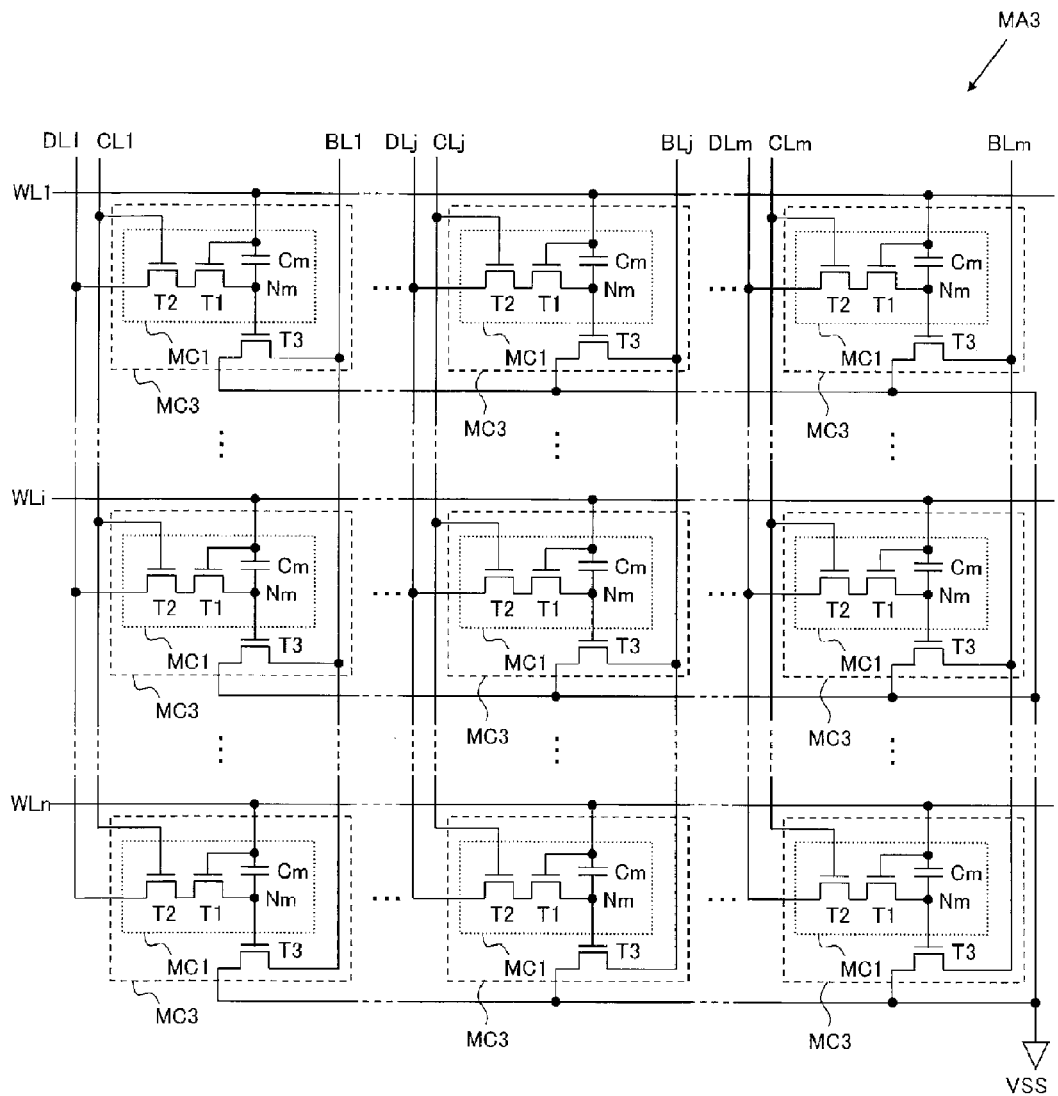
FIG. 3 is an equivalent circuit diagram showing an example of a circuit configuration of a memory cell array when an NVRAM is formed as an example of a semiconductor storage device of the present invention.

FIG. 3 shows an equivalent circuit diagram of an NVRAM memory cell array MA3. The memory cell array MA3 is configured by aligning a plurality of the memory cells MC and a plurality of memory cells MC3 including the third transistors T3 in a matrix in the row direction and in the column direction. In Embodiment 2, one third transistor T3 is provided for each memory cell MC3 as a reading transistor for the data stored in the storage node Nm. In FIG. 3, the memory cell array MA3 having a matrix with m rows and n columns is shown as an example. Furthermore, the memory cell array MA3 is provided with an n number of wordlines WL (WL1, WL2, . . . , WLn) that extend in the row direction, an m number of write control lines CL (CL1, CL2, . . . , CLm) that extend in the column direction, an m number of data input lines DL (DL1, DL2, . . . , DLm) that extend in the column direction, and an m number of reading signal lines BL (BL1, BL2, . . . , BLm) that extend in the column direction.

As shown in FIG. 3, the first control terminals CG of the memory cells MC3 in the same row (row i) are connected to a shared wordline WL (WLi), the second control terminals SG of the memory cells MC3 in the same column (column j) are connected to a shared write control line CL (CLj), the data input terminals Din of the memory cells MC3 in the same column (column j) are connected to a shared data input line DL (DLj), and the drains of the third transistors T3 of the memory cells MC3 in the same column (column j) are connected to a shared reading signal line BL (BLj). Furthermore, the sources of the third transistors T3 of the respective memory cells MC3 are connected to each other and are fed a common reference voltage Vss (0V, for example).

Figure 4:
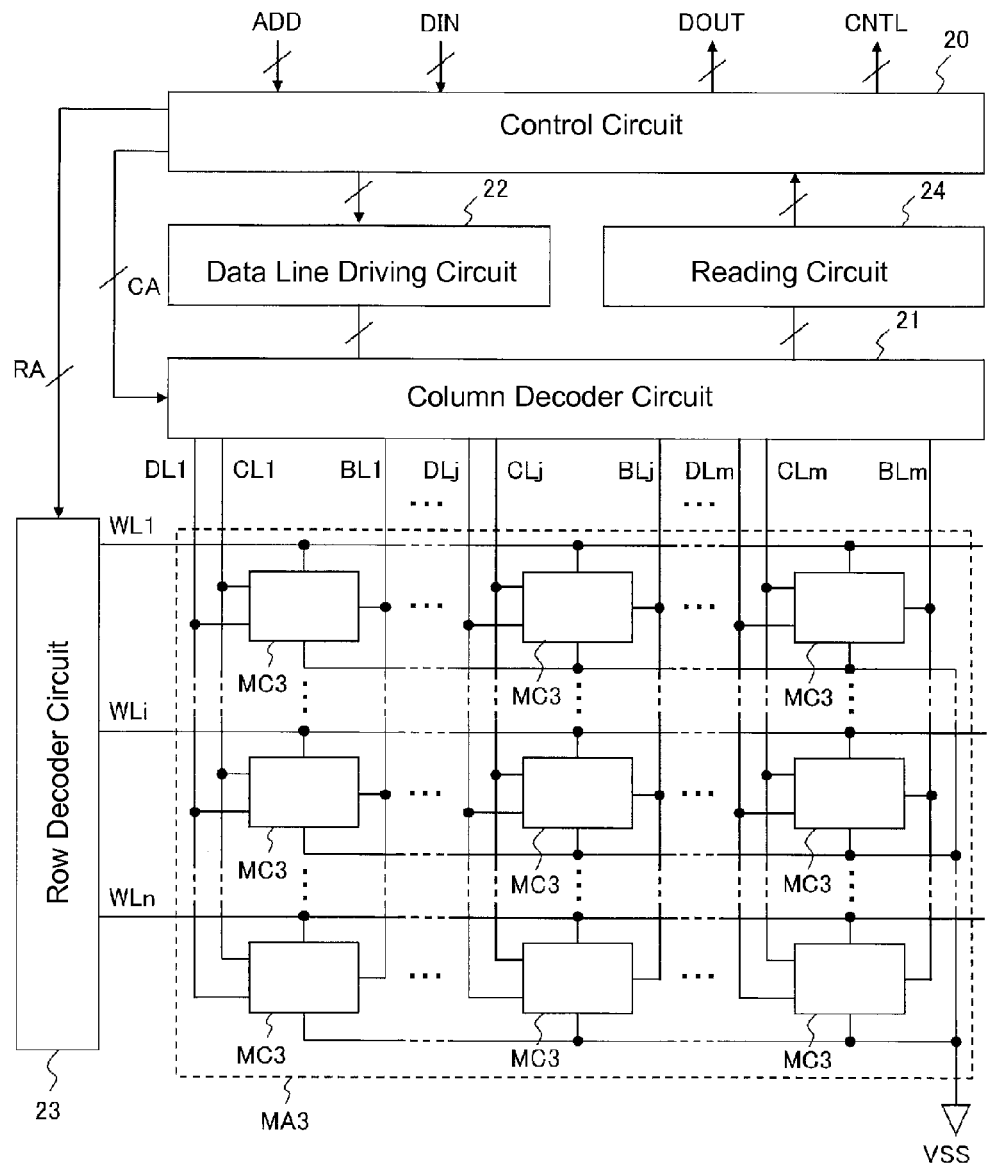
FIG. 4 is a block diagram of a schematic configuration of an NVRAM as an example of a semiconductor storage device of the present invention.

FIG. 4 is a block diagram of a schematic configuration that shows a configuration example of the NVRAM including the memory cell array MA3. In Embodiment 2, the NVRAM is provided with a control circuit 20, a column decoder circuit 21, a data input line driver circuit 22, a row decoder circuit 23, and a reading circuit 24.

The control circuit 20 sends and receives to and from outside of the NVRAM an address signal ADD, a data input signal DIN, a data output signal DOUT, a control signal CNTL that controls memory operations such as writing and reading, and the like. The control circuit 20 generates a column address signal CA for selecting the write control line CL to which data is to be written or the reading signal line BL through which data is to be read, and feeds the column address signal CA to the column decoder circuit 21. The control circuit 20 generates a row address signal RA for selecting the wordline WL to which data is to be written or from which data is to be read and supplies the row address signal RA to the row decoder circuit 23. The control circuit 20 makes a command to apply to the data input line DL data input voltages Vd0 and Vd1 that correspond to the data input signals DIN, and the information RD detected based on the read current Ir flowing to the third transistor T3 in the reading circuit 24 is converted to the data output signal DOUT and outputted. Furthermore, the control circuit 20 controls the memory operation mentioned above based on the control signal CNTL inputted from outside. As mentioned above, the control circuit 20 is a combination of an address input buffer, a data input/output circuit, a control signal input buffer, a control circuit for memory operations, and the like of a usual semiconductor storage device, and can be realized by applying known circuit configurations of a semiconductor storage device. A detailed description of the circuit configuration is not provided as this is not the main point of the present invention.

The column decoder circuit 21 is a circuit that selects the write control line CL and the data input line DL to which data is to be written during writing operations and selects the reading signal line BL to be read during reading operations, on the basis of the column address signal CA. During writing operations, a second selection voltage Vs2 is applied to the write control line CL connected to the memory cells MC3 of one or more selected rows to which data is to be written, and the second transistor T2 of the memory cell MC3 is controlled to be ON. The second transistor write control line T2 of the memory cells MC3 in the non-selected column is controlled to be OFF by applying a second non-selection voltage Vu2 to the write control line CL that is connected to the memory cell MC3 of the non-selected column to which data is not to be written. Furthermore, during the writing operation, the data input line driver circuit 22 applies data input voltages Vd0 and Vd1 that correspond to the input data to the data input line DL selected by the column decoder circuit 21. Furthermore, during the read operation, the read current Ir that is outputted from the drain of the third transistor T3 of the memory cell MC3 connected to the reading signal line BL selected by the column decoder circuit 21, or the voltage change of the selected reading signal line BL due to the read current Ir, is selectively transmitted to the reading circuit 24. The column decoder circuit 21 may be configured so as to be divided into three circuit portions including a column decoder circuit that selects the write control line CL, a column decoder circuit that selects the data input line DL, and a column decoder circuit that selects a reading signal line BL. The respective functions of the column decoder circuit 21 mentioned above can be achieved by applying a known circuit configuration for the column decoder circuit. Details of the circuit configuration are not the main point of the present invention, and thus a detailed description thereof is not provided.

The data input line driver circuit 22 applies the data input voltages Vd0 and Vd1 that correspond to the input data to the data input line DL selected by the column decoder circuit 21. The data input line DL that is not selected by the column decoder circuit 21 and to which data is not to be written, as mentioned later, may be in a floating state as the second transistor T2 is in an OFF state regardless of voltage application state. The data input line driver circuit 22 can be attained by using known signal line driving circuits or the like. Details of the circuit configuration thereof are not the main point of the present invention, and thus, a detailed description thereof is not provided.

The row decoder circuit 23 is a circuit that selects the wordline WL on which the writing operation and the read operation are to be performed based on the row address signal RA. Specifically, during the writing operation, the first selection voltage Vs1 is applied to the wordline WL connected to the memory cell MC3 of a selected row to which data is to be written so that the first transistor T1 of the memory cell MC3 in the selected row is controlled to be ON; the first non-selection voltage Vu1 is applied to the wordline WL connected to the memory cell MC3 in the selected row to which data is not to be written so that the first transistor T1 of the memory cell MC3 in the non-selected row is controlled to be OFF. Furthermore, during the read operation, the read voltage Vr is applied to the wordline WL connected to the memory cell MC3 of a selected row that is to be read so that the third transistor T3 of the memory cell M3 in the selected row is controlled to be active; the non-selection voltage Vu1 is applied to the wordline WL that is connected to the memory cell MC3 of a non-selected row so that the third transistor T3 is controlled to be inactive. The active state and the inactive state are the same as in Embodiment 1. The row decoder circuit 23 can be attained based on known row decoder circuits and the like. Details of the circuit configuration are not the main point of the present invention, and thus a detailed description thereof is not provided.

During the reading operation, the reading circuit 24 selectively detects either the value of the reading current Ir flowing, from drain to source in the active third transistor T3 of the memory cell MC3 in a row selected by the row decoder circuit 23 through the reading signal line BL selected by the column decoder circuit 21, based on the voltage state of the storage node Nm, or a change in voltage on the selected reading signal line BL occurring due to the reading current Ir, and then reads information stored in the selected memory cell MC3 located in the selected row and selected column. In a case in which the voltage change of the selected reading signal line BL is to be detected, the reading circuit 24 is a sense amplifier that is of a voltage detection type, and in a case in which the read current Ir value is to be detected, the reading circuit 24 is a sense amplifier that is of a current detection type. The specific circuit configuration of the reading circuit 24 is not the main point of the present invention and known circuit configurations of sense amplifiers can be used for a sense amplifier that is of a voltage detection type or a current detection type. Thus, detailed descriptions thereof are omitted.

With the circuit configuration above, it is possible to select the row and column of the NVRAM memory cell array MA3 and performing writing and reading on individual memory cells MC3. The writing operation is the same as the writing operation for the single memory cell MC described in Embodiment 1, and thus repeated descriptions are omitted.

The read operation, as mentioned above, is realized by the row decoder circuit 23 applying read voltage Vr to the wordline WL of the selected row, activating the third memory cell element T3 of the memory cell MC3 of the selected row, and the column decoder circuit 21 selectively transmitting to the reading circuit 24 either the voltage change of the selected reading signal line BL that occurs due to the read current Ir, or the read current Ir that flows from the drain to the source of the third transistor T3 of the memory MC3 connected to the selected reading signal line BL of the selected row based on the voltage state of the storage node Nm, so that the reading circuit 24 reads information stored in the selected memory cell MC3 located in the selected row and the selected column. As mentioned above, the third transistor T3 of the non-selected memory cell MC3 in the non-selected column that is connected to the same selected reading signal line BL is in an inactive state and thus the read current Ir does not flow; therefore, the read operation of the selected memory cell MC3 does not receive interference from the storage state of the non-selected memory cell MC3.

In Embodiment 2, the memory cell array MA3 has a plurality of memory cells MC (first and second transistors T1 and T2 and capacitor Cm) respectively aligned in the row direction and the column direction. Also, as shown in FIG. 2, the memory cell array MA3 has an upper memory cell array that has each memory cell MC formed on an upper side of the gate 5 of the third transistor T3 and the insulating film 6 and a lower memory cell array that has a plurality of the third transistors T3 that are aligned in the row direction and in the column direction in a matrix on the silicon substrate 1, the upper and lower memory cell arrays forming a double layer structure (three-dimensional structure).

Embodiment 3

A logic device including a field programmable gate array (FPGA), a programmable logic device (PLD), or the like that is constituted of the memory cell MC described in Embodiment 1 and that has a reconfigurable logic circuit will be schematically described.

In Embodiment 3, a memory cell array MA that is formed by arranging a plurality of memory cells MC (MC1 or MC2) described in Embodiment 1 in a matrix is used as a configuration memory that stores data defining the logical structure of a reconfigurable logic circuit. Then, a third memory cell element T3 having a gate to which a storage node Nm of each memory cell MC is connected is used as a transistor that functions as a switch that switches the logical structure mentioned above.

Figure 5:
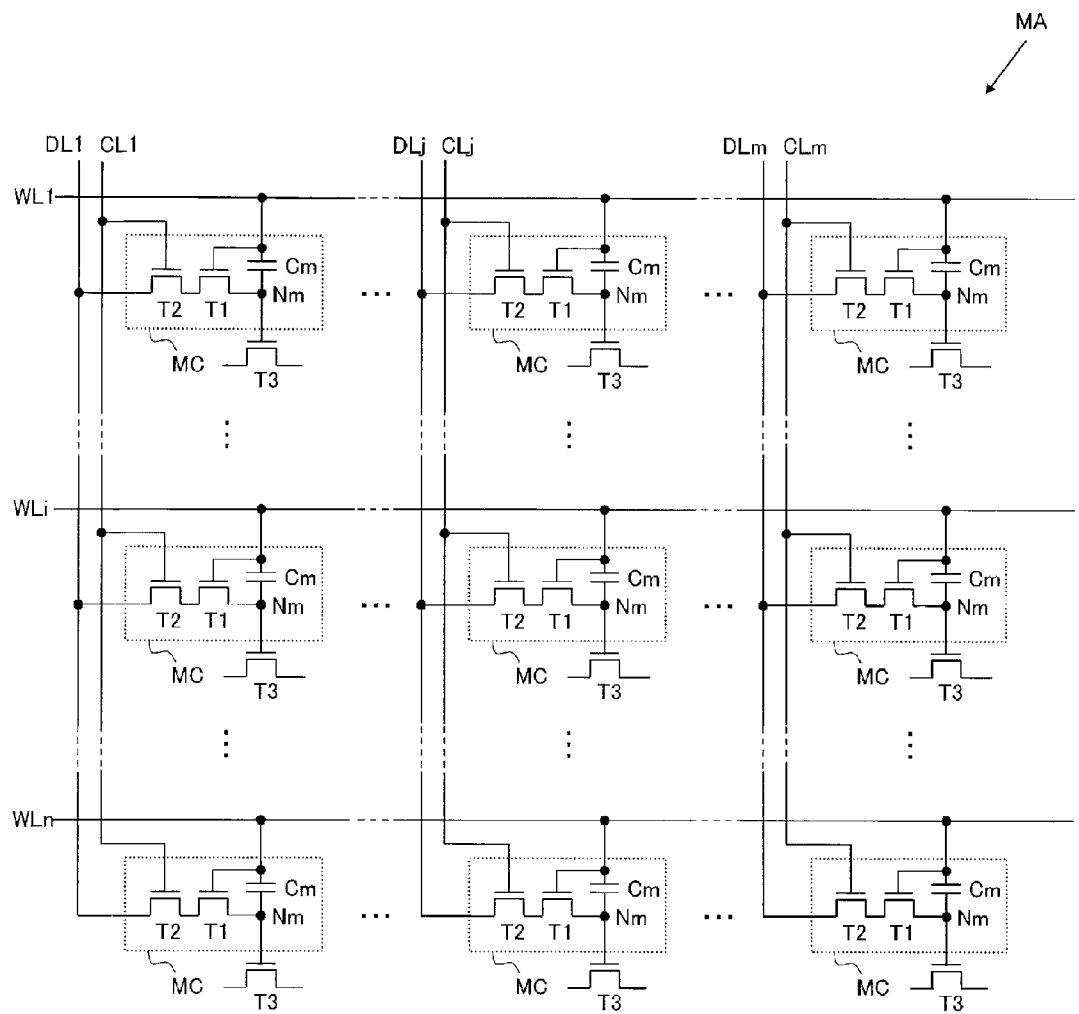
FIG. 5 is an equivalent circuit diagram showing an example of a circuit configuration of a memory cell array when a reconfigurable logic circuit is formed as an example of a semiconductor storage device of the present invention.
Figure 6:
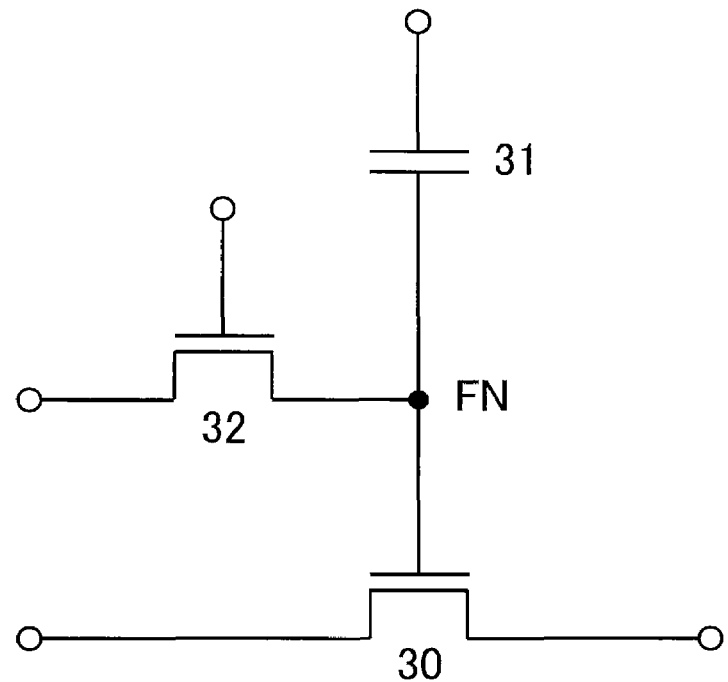
FIG. 6 is an equivalent circuit diagram showing an example of a semiconductor storage device including a conventional oxide semiconductor insulated-gate FET.

In FIG. 5, an equivalent circuit diagram of the memory cell array MA used as the above-mentioned configuration memory is shown. In Embodiment 3, in a manner similar to the memory cell MC, a plurality of the third transistors T3 are also arranged in a matrix in the row direction and the column direction. However, the connection of the drain and the source of the respective third transistors T3 differs depending on the architecture of the logic device, and thus, FIG. 5 does not show where the drain and source of the third transistors T3 are connected. Thus, in the memory cell array MA of Embodiment 3, the reading signal line BL shown in Embodiment 2 is not necessarily present. An n number of wordlines WL (WL1, WL2, . . . , WLn) that extend in the row direction, an m number of write control lines CL (CL1, CL2, . . . , CLm) that extend in the column direction, and an m number of data input lines DL (DL1, DL2, . . . , DLm) that extend in the column direction are needed for the writing operation to individual memory cells MC in the memory cell array MA, and thus, these wiring lines are present in a manner similar to Embodiment 2.

In Embodiment 3, the storage state of each memory cell MC is used in the logic device including the logic circuit and the memory cell array MA3, and thus, the storage state does not need to be read outside of the logic device for individual memory cells MC, and thus, as an example, a reading signal line BL is not provided. Thus, as in Embodiment 2, the data input line DL does not need to extend in the column direction to be parallel to the reading signal line BL, and thus, an n number of data input lines DL (DL1, DL2, . . . , DLn) may be disposed so as to extend in the row direction. In this case, a data input terminal Din of the memory cell MC3 is connected to a shared data input line DL (DLi) in the same row (row i). In a case in which the storage state of each memory cell MC is read from individual memory cells MC to be used in logic devices, the reading signal line BL may be provided.

Furthermore, in Embodiment 3, as shown in FIG. 2, the memory cell array MA is formed on the upper side of the gate 5 of the third transistor T3 and the insulating film 6, and the logic circuit portion includes the third transistor T3 that is formed over the silicon substrate 1. The logic device in Embodiment 3 has a double layer structure (three-dimensional structure) in which the memory cell array MA, which is a configuration memory, is formed on the logic circuit portion formed on the silicon substrate 1. As a result, the chip size of the logic device can be reduced.

Other Embodiments

Descriptions of other embodiments are provided below.

(1) In Embodiments 1 and 2, the configurations had one data input line DL (DL1, DL2, . . . , DLm) provided for each memory cell MC3 and MC in each column of the memory cell arrays MA3 and MA. However, in an application example in which data is not written simultaneously between two adjacent columns, there may be one data input line DL shared between the two adjacent columns of memory cells MC3 and MC.

(2) In the respective embodiments above, it is assumed that the third transistor T3 is an n-channel MOSFET, but the third transistor T3 may be a p-channel MOSFET. Furthermore, there may be two or more third transistors T3 provided for each memory cell MC.

Furthermore, the third transistor T3 may have a transistor structure (TFT) similar to the first and second transistors T1 and T2 without forming the third transistor T3 over a silicon substrate 1. In this case, the NVRAM of Embodiment 2 can be formed in the logic circuit such as the CPU formed over the silicon substrate 1.

(3) The threshold voltage of the first and second transistors T1 and T2 described in Embodiment 1, the threshold voltage of the third transistor T3, the first selection voltage Vs1, the second selection voltage Vs2, the first non-selection voltage Vu1, the second non-selection voltage Vu2, the data input voltage Vd0 and Vd1, the read voltage Vr, and the capacitance ratio R, are examples, and are not limited to the specific values in the description above.

DESCRIPTION OF REFERENCE CHARACTERS 1 silicon substrate
2 drain region of the third transistor
3 source region of the third transistor
4 first gate insulating film
5 gate of third transistor
6 insulating film
7 oxide semiconductor: first active region (channel region)
8 oxide semiconductor: second active region (channel region)
9 oxide semiconductor: third active region
10 first metal electrode
11 second metal electrode
12 third metal electrode
13 second gate insulating film
14 gate of first transistor
15 third gate insulating film
16 gate of second transistor
17 insulating film
18 fourth insulating film
19 electrode
20 control circuit
21 column decoder circuit
22 data input line driver circuit
23 row decoder circuit
24 reading circuit
30 silicon MOSFET
31 capacitor
32 oxide semiconductor MOSFET
ADD address signal
BL (BL1, BL2, . . . , BLm) reading signal line
CA column address signal
CG first control terminal
CNTL control signal
CL (CL1, CL2, . . . , CLm) write control line (second control line)
Cm capacitor
Din data input terminal
DIN data input signal
DIO data input/output terminal
DL (DL1, DL2, . . . , DLm) data input line
DOUT data output signal
MA memory cell array
MA3 NVRAM memory cell array
MC, MC1, MC2 memory cell
MC3 memory cell array for NVRAM
Nm storage node
RA row address signal
RD detected information
SG second control terminal
T1 first transistor
T2 second transistor
T3 third transistor
Vss reference voltage
WL (WL1, WL2, . . . , WLn) wordline (first control line)

What is claimed is:

1. A semiconductor storage device, comprising:
a memory cell including a first transistor that is an oxide semiconductor insulated-gate field-effect transistor, a second transistor that is an oxide semiconductor insulated-gate field-effect transistor, and a capacitor; and
a third transistor,
wherein either one of a drain and a source of the first transistor is connected to one end of the capacitor, defining a storage node,
wherein another of the drain or the source of the first transistor is connected to one of a drain or a source of the second transistor,
wherein another of the drain or the source of the second transistor is a data input terminal,
wherein a first control terminal, defined by a connection between another end of the capacitor and either one of respective gates of the first transistor and the second transistor, is connected to a first control line extending in a first direction,
wherein a second control terminal that is another of the respective gates of the first transistor or the second transistor is connected to a second control line extending in a second direction that is perpendicular to the first direction, and
wherein the storage node between the first transistor and the capacitor is connected to a gate of the third transistor and controls a current flowing between a drain and a source of the third transistor according to a voltage level of the storage node.

2. The semiconductor storage device according to claim 1, wherein the first transistor and the second transistor are thin film transistors formed on an insulating film formed over a surface of a semiconductor substrate where the third transistor is formed.

3. The semiconductor storage device according to claim 1, wherein an oxide semiconductor that forms the first transistor and the second transistor is InGaZnO.

4. The semiconductor storage device according to claim 1, comprising:
a memory cell array that has a plurality of said memory cells of claim 1 arranged in a matrix in the first direction and the second direction,
wherein each of said plurality of memory cells is provided with the third transistor as a transistor for reading data stored in the storage node between the first transistor and the capacitor,
wherein every row of memory cells in the memory cell array extending in the first direction shares the first control line extending in the first direction,
wherein every column of the memory cells in the memory cell array extending in the second direction shares the second control line extending in the second direction, and wherein the data input terminals of the plurality of memory cells in each row in the first direction are connected to a shared data input line extending in the first direction, or the data input terminals of the plurality of memory cells in each column in the second direction are connected to a shared data input line extending in the second direction.

5. The semiconductor storage device according to claim 4, wherein drains or sources of a plurality of the third transistors arranged in each column in the second direction are connected to a shared reading signal line extending in the second direction, and wherein the data input terminals of the plurality of the memory cells arranged in each column in the second direction are connected to the data input line extending in the second direction, shared therebetween.

6. The semiconductor storage device according to claim 4, wherein the third transistor is a transistor used in a reconfigurable logic circuit.

* * * * *